(12) United States Patent
Kimura et al.

(10) Patent No.: US 9,178,479 B2
(45) Date of Patent: Nov. 3, 2015

(54) DYNAMIC RANGE CONTROL APPARATUS

(75) Inventors: Masaru Kimura, Tokyo (JP); Hirohisa Tasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 163 days.

(21) Appl. No.: 14/122,482

(22) PCT Filed: Sep. 15, 2011

(86) PCT No.: PCT/JP2011/005216
§ 371 (c)(1),
(2), (4) Date: Nov. 26, 2013

(87) PCT Pub. No.: WO2013/038451
PCT Pub. Date: Mar. 21, 2013

(65) Prior Publication Data
US 2014/0086435 A1    Mar. 27, 2014

(51) Int. Cl.
| H03G 3/00 | (2006.01) |
| H03G 3/20 | (2006.01) |
| H03G 5/00 | (2006.01) |
| H03G 5/16 | (2006.01) |
| G10L 21/02 | (2013.01) |

(52) U.S. Cl.
CPC .............. *H03G 3/20* (2013.01); *H03G 5/005* (2013.01); *H03G 5/165* (2013.01); *G10L 21/02* (2013.01)

(58) Field of Classification Search
CPC ......... H03G 3/20; H03G 5/165; H03G 5/005; G10L 21/02
USPC ................... 381/107, 103, 98, 104, 102, 106
See application file for complete search history.

(56) References Cited

U.S. PATENT DOCUMENTS

2005/0123153 A1*  6/2005  Toki .............................. 381/106

FOREIGN PATENT DOCUMENTS

| JP | 2000 22473 | 1/2000 |
| JP | 2001 276737 | 10/2001 |
| JP | 2003 299181 | 10/2003 |
| JP | 2004 72561 | 3/2004 |
| JP | 2005 175674 | 6/2005 |
| JP | 2006 42027 | 2/2006 |
| JP | 3986390 | 7/2007 |
| WO | 2008 041321 | 4/2008 |
| WO | 2009 110087 | 9/2009 |

OTHER PUBLICATIONS

International Search Report Issued Oct. 18, 2011 in PCT/JP11/005216 Filed Sep. 15, 2011.

\* cited by examiner

*Primary Examiner* — Paul S Kim
(74) *Attorney, Agent, or Firm* — Oblon, McClelland, Maier & Neustadt, L.L.P.

(57) ABSTRACT

Filters 106-1-106-N divide an input signal 100 into N band-limited signals 107-1-107-N, and multipliers 108-1-108-N carry out dynamic range control of the N band-limited signals 107-1-107-N, respectively. After that, filters 111-1-111-N eliminate odd harmonics caused by the dynamic range control, and a signal synthesis unit 113 combines the signals passing through the filters 111-1-111-N into a single output signal 114.

6 Claims, 8 Drawing Sheets

(a)

(b)

DYNAMIC RANGE CONTROL APPARATUS

TECHNICAL FIELD

The present invention relates to a dynamic range control apparatus that controls the rate of change of the volume level of a sound signal or the dynamic range thereof.

BACKGROUND ART

A signal processing apparatus has been known which controls the dynamic range (ratio of the maximum value to the minimum value of a volume level) of various types of audio contents such as a music signal downloaded via the Internet, an audio signal packaged in a Blu-ray (registered trademark) Disk (BD), Digital Versatile Disk (DVD), or Compact Disk (CD), and a radio or TV broadcast audio signal. Carrying out the dynamic range control enables raising a low volume level of a sound signal or reversely lowering a high volume level of the sound signal, thereby being able to keep the volume level of the various contents at a uniform level.

For example, an AGC (automatic gain control) apparatus disclosed in Patent Document 1 comprises a first smoothing unit that smoothes an input acoustic signal at a time constant T1 and a second smoothing unit that smoothes it at a time constant T2 (>T1), thereby generating output signals with two volume levels. Then, it controls the dynamic range at an attack in accordance with the volume level of the output signal smoothed at the time constant T1, and controls the dynamic range at a release in accordance with the volume level of the output signal smoothed at the time constant T2. Here, the term "at an attack" refers to a case where the level varies from a low volume level to a high volume level, and the term "at a release" refers to a case where the level varies from a high volume level to a low volume level. Switching between the two time constants T1 and T2, the AGC apparatus can control the dynamic range while suppressing the production of unnatural sounds at the volume level change.

PRIOR ART DOCUMENT

Patent Document 1

Patent Document 1: Japanese Patent Application Laid-Open No. 2004-72561.

DISCLOSURE OF THE INVENTION

Problems to be Solved by the Invention

The signal processing technique disclosed in the Patent Document 1, however, has a problem of a waveform distortion of the output signal due to the dynamic range control.

The waveform distortion appears as odd harmonics. FIG. 6 shows an example of odd harmonics caused by the conventional dynamic range control: FIG. 6(a) shows frequency characteristics of a 1 kHz sine wave which is an input signal to the AGC apparatus; and FIG. 6(b) shows frequency characteristics of an output signal when the input signal undergoes the dynamic range control, in which the vertical axis shows the volume level [dB] and the horizontal axis shows the frequency [kHz]. In FIG. 6(b), it is found that the dynamic range control causes the odd harmonics at 3, 5, 7 kHz and so on. Since such an occurrence of the odd harmonics can lead to sound quality deterioration, the conventional dynamic range control technique causes a problem of the sound quality.

Here, the principle of generating the odd harmonics by the dynamic range control will be described briefly. FIG. 7(a) is a graph showing a time waveform of a 1 kHz sine wave. FIG. 7(b)-FIG. 7(d), which show odd harmonics of the 1 kHz sine wave, show time waveforms of the third harmonic (3 kHz), fifth harmonic (5 kHz) and seventh harmonic (7 kHz), respectively. In addition, FIG. 8 is a graph showing, against the input signal of the 1 kHz sine wave (shown by broken line), a time waveform (shown by solid line) of an output signal formed by carrying out gain control of the third, fifth and seventh harmonics, followed by adding them. It is assumed in FIG. 7 and FIG. 8 that the times as to the vertical axes are synchronized.

The term "dynamic range control" refers to signal processing that varies the output amplitude in accordance with the amplitude of the input signal (1 kHz sine wave, in this example). Thus, to make large amplitude smaller (or greater) than the amplitude of an input signal, for example, equivalent processing can be executed by adding odd harmonics that have peak absolute values at the same position as the peak values of the input signal. In this connection, as for the even harmonics, since they have peak values at the position different from that of peak values of the input signal, the equivalent processing cannot be carried out with them.

As for the third harmonic of FIG. 7(b) and the seventh harmonic of FIG. 7(d), since they have negative peak values for the peak values of the input signal of FIG. 7(a), adding the third and seventh harmonics has a function of reducing the peaks of the waveform of the input signal (indicated by a down arrow in FIG. 8). On the contrary, as for the fifth harmonic of FIG. 7(c) (although not shown, the same for the ninth harmonic), since it has positive values for the peak values of the input signal, adding these harmonics has a function of increasing the peak values of the input signal (indicated by an up arrow in FIG. 8).

On the other hand, as shown by broken lines in FIG. 7, in one period of the input signal, the sine wave has four points at which any given amplitude except for the peak and zero has the same absolute value of the amplitude, and the odd harmonics have the same amplitude at the four points each. Accordingly, the signal processing of adding (or subtracting) the odd harmonics can carry out the dynamic range control that makes any given amplitude except for the peak and zero greater (or less) than the input signal equivalently.

Thus, it is inevitable for the dynamic range control, which varies the output amplitude in accordance with the amplitude of the input signal, to generate odd harmonics equivalently.

The present invention is implemented to solve the foregoing problem. Therefore it is an object of the present invention to provide a dynamic range control apparatus capable of achieving the dynamic range control without sound quality deterioration by suppressing the generation of odd harmonics.

Means for Solving the Problem

A dynamic range control apparatus in accordance with the present invention comprises: a volume level calculating unit that calculates a volume level value approximately proportional to a volume level of an input sound signal; a gain calculating unit that calculates a gain factor corresponding to the volume level value calculated by the volume level calculating unit; a first filter group including N filters that split the sound signal into N (>1) frequency bands, and output N band-limited signals; N multipliers that multiply the N band-limited signals output from the first filter group by the gain factor calculated by the gain calculating unit to carry out gain control; a second filter group including N filters that extract prescribed frequency bands from the N band-limited signals output from the N multipliers, respectively; and a signal synthesis unit that combines the N band-limited signals output from the second filter group into a single signal.

The dynamic range control apparatus in accordance with the present invention comprises: a first filter group including N filters that split an input sound signal into N (>1) frequency bands, and output N band-limited signals; N volume level calculating units that calculate N volume level values approximately proportional to volume levels of the N band-limited signals output from the first filter group; N gain calculating units that calculate N gain factors corresponding to the N volume level values calculated by the N volume level calculating units; N multipliers that multiply the N band-limited signals output from the first filter group by the N gain factors calculated by the N gain calculating units to carry out gain control; a second filter group including N filters that extract prescribed frequency bands from the N band-limited signals output from the N multipliers, respectively; and a signal synthesis unit that combines the N band-limited signals output from the second filter group into a single signal.

Advantages of the Invention

According to the present invention, the band-limited signals after the gain control undergo the filtering processing by the second filter group so as to eliminate the odd harmonics generated by the gain control. Accordingly, it can provide a dynamic range control apparatus capable of carrying out the dynamic range control without any sound quality deterioration.

BRIEF DESCRIPTION OF THE DRAWINGS

FIG. 6 is a graph showing an example of odd harmonics generated by conventional dynamic range control, in which FIG. 6(a) shows an input signal and FIG. 6(b) shows an output signal;

FIG. 7 is a graph showing the principle of generation of odd harmonics by the conventional dynamic range control, in which FIG. 7(a) shows a time waveform of an input signal and FIG. 7(b)-FIG. 7(d) show third, fifth and seventh harmonics, respectively.

BEST MODE FOR CARRYING OUT THE INVENTION

The best mode for carrying out the invention will now be described with reference to the accompanying drawings to explain the present invention in more detail.

Embodiment 1

Figure 1:
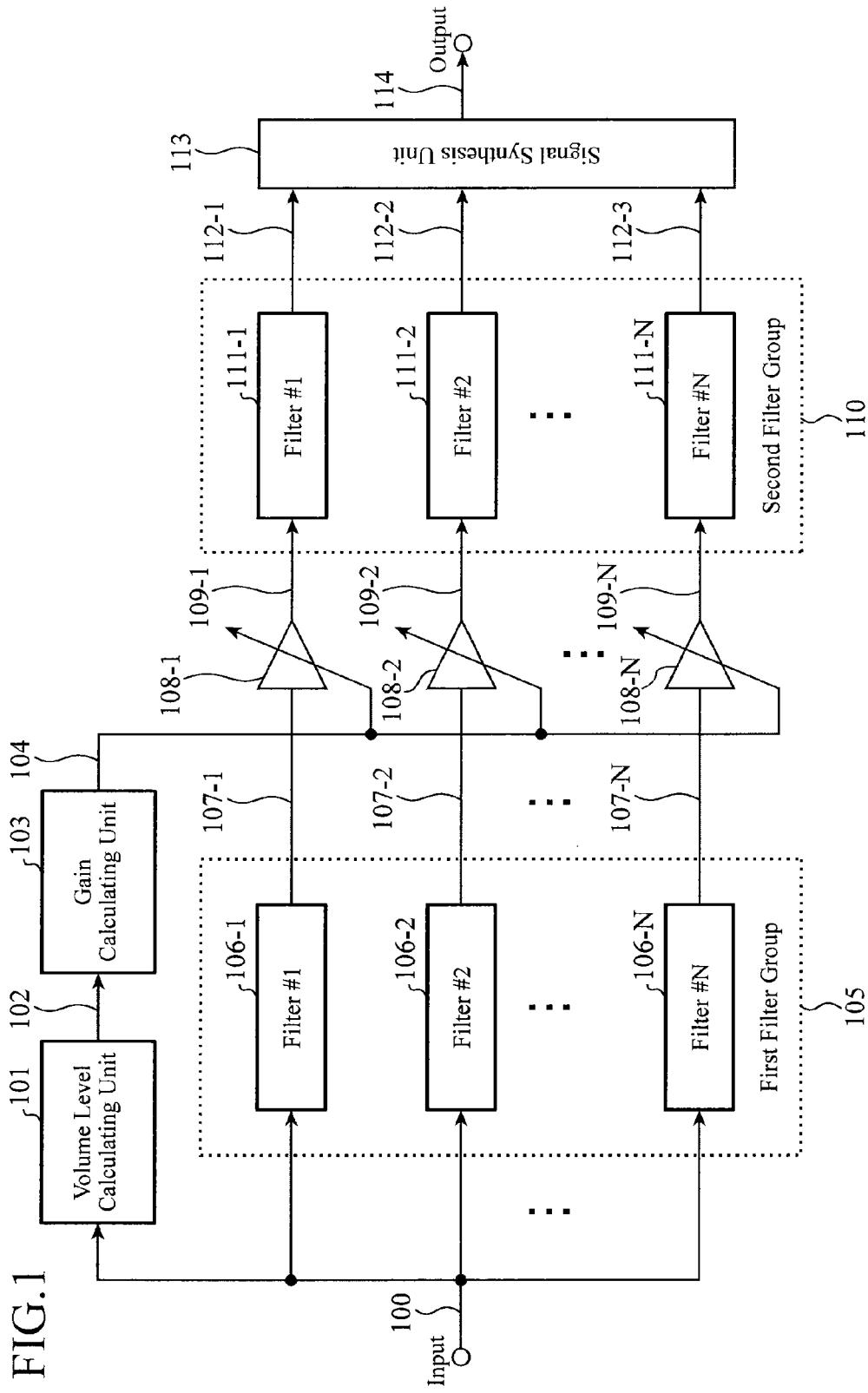
FIG. 1 is a block diagram showing a configuration of a dynamic range control apparatus of an embodiment 1 in accordance with the present invention.

As shown FIG. 1, a dynamic range control apparatus of the present embodiment 1 comprises a volume level calculating unit 101, a gain calculating unit 103, a first filter group 105, N (>1) multipliers 108-1-108-N, a second filter group 110 and a signal synthesis unit 113. The first filter group 105 comprises N filters 106-1-106-N, and the second filter group 110 comprises N filters 111-1-111-N as well.

The input signal 100 input to the dynamic range control apparatus is branched and delivered to the volume level calculating unit 101 and N filters 106-1-106-N constituting the first filter group 105. As the input signal 100, any audio contents can be used such as a music signal downloaded via the Internet, a packaged music signal such as that stored in a BD, DVD or CD, and a music signal of a radio or TV broadcast.

The volume level calculating unit 101 calculates a volume level value of the input signal 100, and delivers the calculated volume level value 102 to the gain calculating unit 103. As for the volume level value 102, it can be any value approximately proportional to the volume level of the input signal 100, and the volume level calculating unit 101 is not limited to a particular volume level calculating device and method.

The volume level calculating unit 101 can smooth the input signal 100 at a prescribed time constant to obtain a single volume level value, for example, and use it as the volume level value 102.

Alternatively, for example, it can smooth the input signal 100 at a plurality of different time constants to obtain a plurality of volume level values, and use them as the volume level value 102.

As a still another example, it can smooth the input signal 100 at a plurality of different time constants to obtain a plurality of volume level values, and use the maximum value of them as the volume level value 102, or a value obtained by a weighting operation as the volume level value 102.

As a still another example, it can detect an instantaneous amplitude of the input signal 100 and use it as the volume level value 102, or use the absolute value of the instantaneous amplitude as the volume level value 102.

Furthermore, the calculating method is not limited to those described above, but a value calculated by any other method can be used as the volume level value 102.

The gain calculating unit 103 calculates a gain factor 104 at the present time (that is, at the point of time of receiving the volume level value) in accordance with the volume level value 102 supplied from the volume level calculating unit 101. The gain calculating unit 103 calculates a small gain factor for a large volume level value and a large gain factor for a small volume level value, for example, but the calculating method is not limited to a specific gain calculating method.

The gain calculating unit 103 can calculate the gain factor 104 from the volume level value 102 using a prescribed conversion table, for example.

Alternatively, it can calculate the gain factor 104 from the volume level value 102 using a prescribed continuous or discontinuous function, for example.

Furthermore, it can calculate the gain factor 104 by any other methods without being limited to the foregoing calculating methods.

Figure 2:
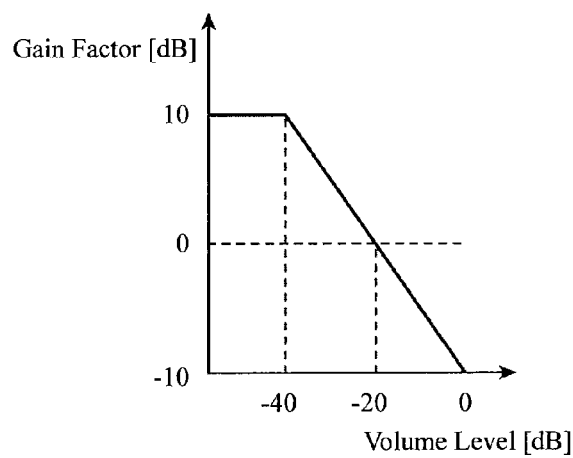
FIG. 2 is a diagram showing in a graph an example of a conversion table a gain calculating unit uses.

Next, an example of a gain factor calculating method of the gain calculating unit 103 will be described. FIG. 2 is a diagram showing in a graph an example of a conversion table between the volume level values and the gain factors, in which the vertical axis shows gain factors [dB], and the horizontal axis shows volume levels [dB]. When the gain calculating unit 103 uses the conversion table of FIG. 2, it calculates, if the volume level value is large such as 0 dB, the gain factor as −10 dB. In contrast, when the volume level value is small such as not greater than −40 dB, it calculates the gain factor as 10 dB. In addition, when the volume level value is within the range of 0 dB to −40 dB, it calculates the gain factor as a value that decreases in accordance with the volume level value. In this example, in particular, when the volume level value is −20 dB, the gain calculating unit 103 calculates the gain factor as 0 dB.

In this way, the gain calculating unit 103 calculates the gain factor 104 in accordance with the volume level value 102, and delivers the calculated gain factor 104 to the N multipliers 108-1-108-N each.

The first filter group 105 comprises the N filters 106-1-106-N. The filters 106-1-106-N extract prescribed bands from the input signal 100, and output N band-limited signals 107-1-107-N.

Here, the present embodiment 1 sets the characteristics of a part or all of the filters so that the bandwidth extracted from the input signal 100 becomes within two octaves.

(1) Setup Example 1 of Filter Characteristics

To be concrete, setting a prescribed frequency f;

Providing the first filter 106-1 with characteristics of a low pass filter (LPF) having a passband not higher than the frequency f;

Providing the second filter 106-2 with characteristics of a band pass filter (BPF) having a passband from the frequency f to 3f (frequency band 2f corresponding to two octaves);

Providing the third filter 106-3 with characteristics of a BPF having a passband from frequency 3f to 9f (frequency band 6f corresponding to two octaves); and Providing the fourth filter 106-4 with characteristics of a BPF having a passband from frequency 9f to 27f (frequency band 18f corresponding to two octaves).

In this way, filter characteristics are set up to the Nth filter 106-N. Incidentally, only the first filter 106-1 does not have the passband within the two octaves in this example. The second to fourth filters 106-2-106-4 have the passband within the two octaves.

(2) Setup Example 2 of Filter Characteristics

The passbands of all the filters 106-1-106-N, however, can be set within two octaves by establishing filter characteristics that will prevent passing a very low frequency $f_L$ or less including a DC component when the input signal 100 is converted from the time domain to the frequency domain. More specifically:

Providing the first filter 106-1 with characteristics of a BPF having a passband from the frequency $f_L$ to $3f_L$;

Providing the second filter 106-2 with characteristics of a BPF having a passband from the frequency $3f_L$ to $9f_L$;

Providing the third filter 106-3 with characteristics of a BPF having a passband from the frequency $9f_L$ to $27f_L$; and Providing the fourth filter 106-4 with characteristics of a BPF having a passband from the frequency $27f_L$ to $81f_L$.

In this way, the passbands of all the filters 106-1-106-N can be set within two octaves by setting up the filter characteristics up to the Nth filter 106-N.

Normally, a person cannot hear a range of 20 Hz or less aurally. Accordingly, setting the frequency $f_L$ at about 20 Hz makes is possible to set the passbands of all the filters 106-1-106-N within two octaves with little reduction of low frequency sounds.

Figure 3:
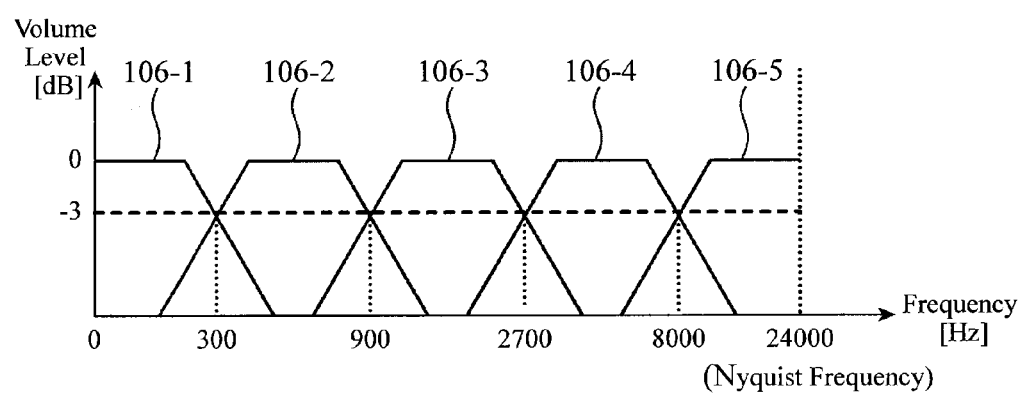
FIG. 3 is a graph showing an example of filter characteristics of a first filter group and a second filter group.

Here, a concrete example of passbands appropriate for the filters 106-1-106-N will be described using FIG. 3. FIG. 3 shows an example of the filter characteristics when the number of filters (the number of band divisions) N=5, the frequency f=300 Hz, and the sampling frequency is 48 kHz, in which the vertical axis shows a volume level [dB], and the horizontal axis shows frequency [Hz]. Incidentally, as for the music signal used as the input signal 100, since its signal components not less than the Nyquist rate is normally cut off in the digitization step, FIG. 3 shows a graph not greater than the Nyquist rate 24000 Hz of the sampling frequency.

FIG. 3 shows a configuration example of the (1) SETUP EXAMPLE 1 of FILTER CHARACTERISTICS:

Providing the first filter 106-1 with characteristics of an LPF having a passband not greater than 300 Hz;

Providing the second filter 106-2 with characteristics of a BPF having a passband of 300 Hz-900 Hz;

Providing the third filter 106-3 with characteristics of a BPF having a passband of 900 Hz-2700 Hz;

Providing the fourth filter 106-4 with characteristics of a BPF having a passband of 2700 Hz-8000 Hz; and Providing the fifth filter 106-5 with characteristics of an HPF (High Pass Filter) having a passband not less than 8000 Hz.

Using the five filters 106-1-106-5 enables the passband of each of the filters 106-2-106-5 except for the first filter 106-1 to have a passband within two octaves.

Incidentally, as will be described later, it is preferable to design the individual filters 106-1-106-5 in such a manner that they have the attenuation of −3 dB at a cutoff frequency (frequency that forms a boundary between adjacent bands).

In this way, the first filter group 105 produces N band-limited signals 107-1-107-N. The band-limited signals 107-1-107-N are supplied to the N multipliers 108-1-108-N, respectively.

The N multipliers 108-1-108-N multiply the band-limited signals 107-1-107-N they each receive by the gain factor 104 delivered from the gain calculating unit 103, and supply the resultant N gain controlled signals 109-1-109-N to the N filters 111-1-111-N constituting the second filter group 110.

Thus, the multipliers 108-1-108-N carryout the gain control (dynamic range control) using the common gain factor 104.

The second filter group 110 comprises N filters 111-1-111-N. The filters 111-1-111-N carry out the filtering processing on the gain controlled signals 109-1-109-N each, and supply the resultant N harmonic eliminated signals 112-1-112-N to the signal synthesis unit 113.

Here, the characteristics of the filters 111-1-111-N constituting the second filter group 110 are set to the same characteristics as those of the filters 106-1-106-N constituting the first filter group 105. The advantages of setting to such characteristics will be described later.

The signal synthesis unit 113 combines the N harmonic eliminated signals 112-1-112-N received into a single signal, and outputs it as the output signal 114 of the dynamic range control apparatus.

Next, the advantages of the dynamic range control apparatus of the present embodiment 1 will be described.

Figure 4A:
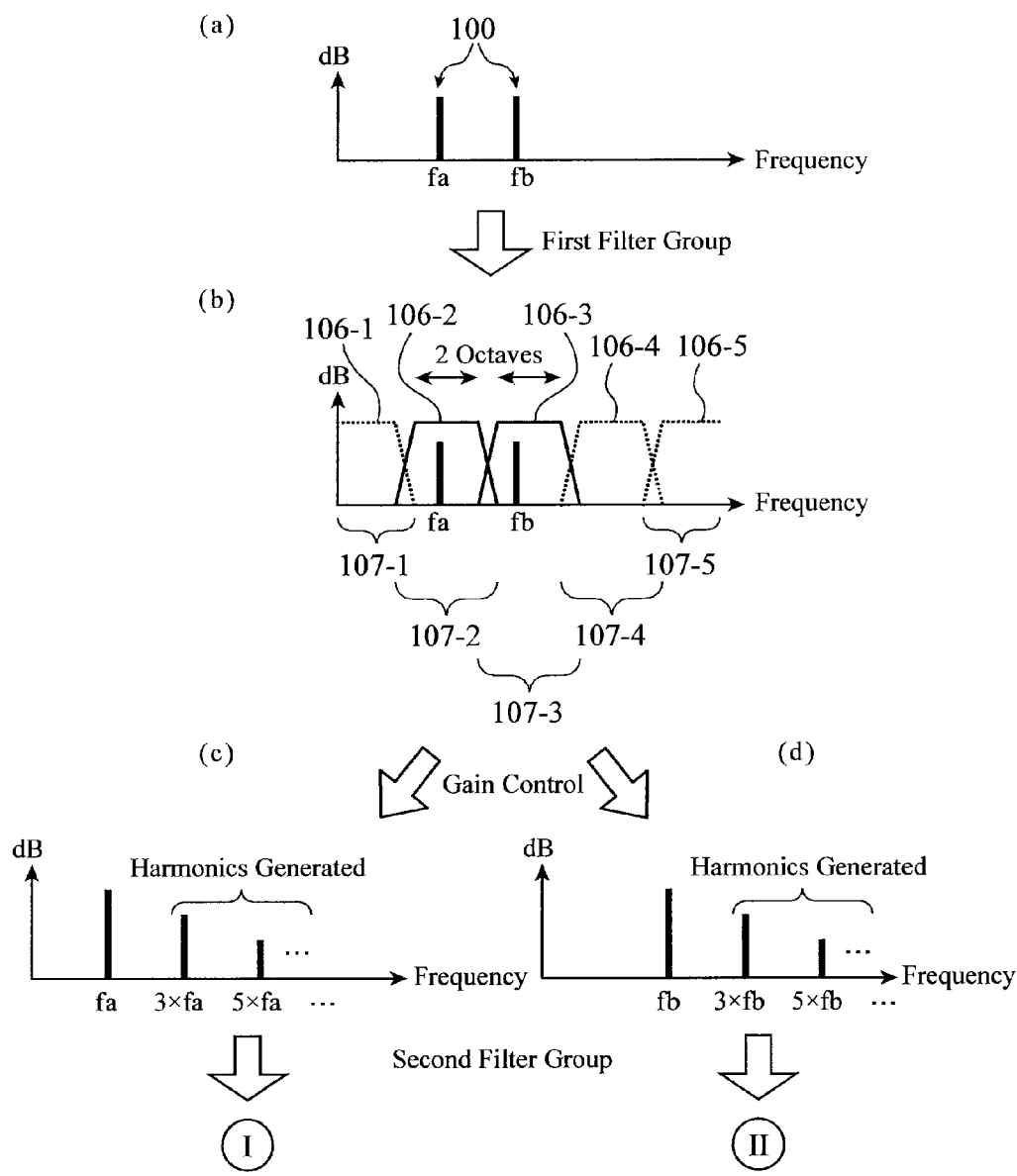
FIG. 4A is a graph showing an alteration example of the frequency characteristics of a signal processed by the dynamic range control apparatus of the embodiment 1.
Figure 4B:
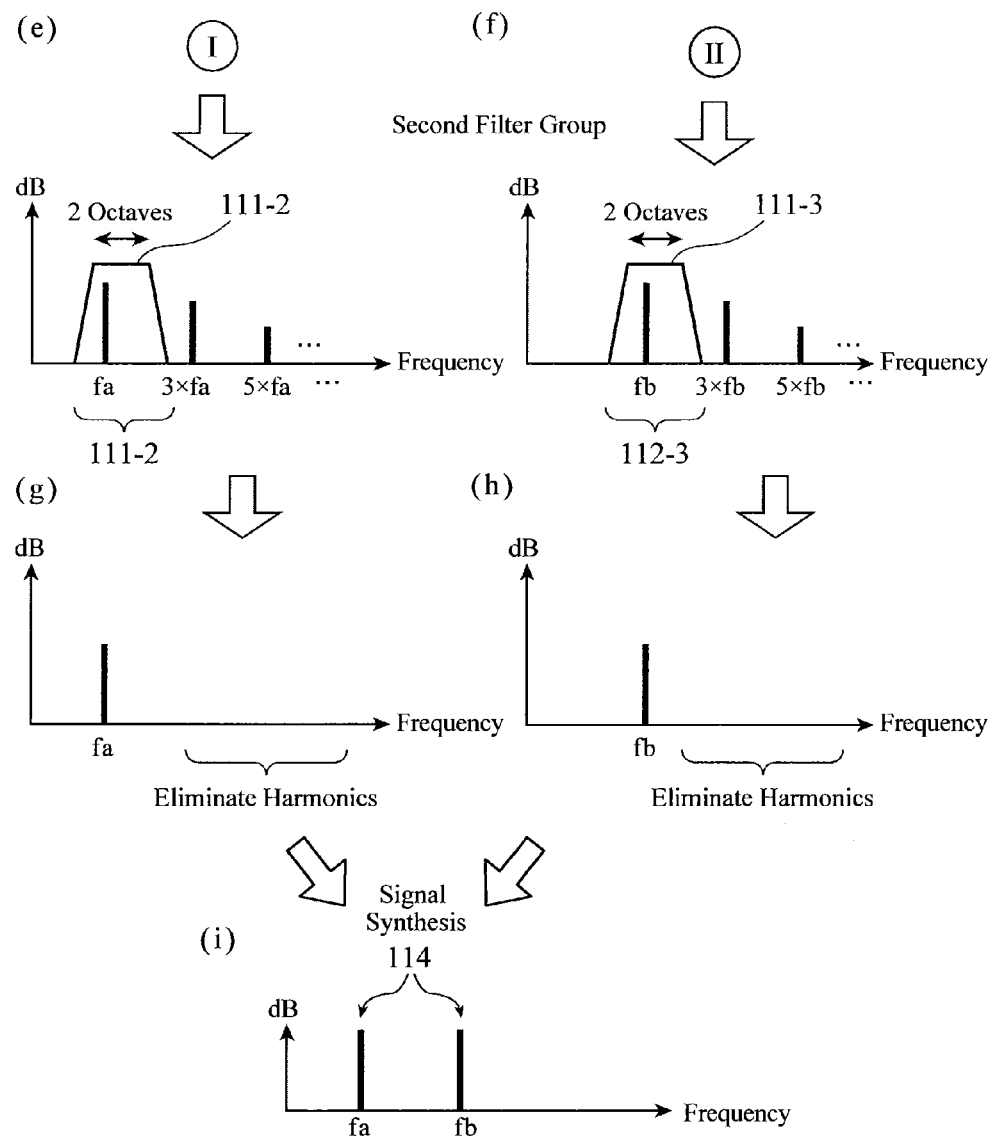
FIG. 4B, which is a continuation of FIG. 4A, is a graph showing an alteration example of the frequency characteristics of the signal processed by the dynamic range control apparatus of the embodiment 1.

FIG. 4A and FIG. 4B are graphs showing an alteration example of the frequency characteristics of the signal processed by the dynamic range control apparatus of the present embodiment 1. It is assumed in this example that the input signal 100 is composed of two frequencies, frequencies fa and fb. In addition, it is assumed that the number of the band divisions N=5, and that the passband of each of the filters 106-2-106-5, and 111-2-111-5 except for the first filters 106-1 and 111-1 is set within two octaves. It is further assumed that the frequency fa is within the passband of the second filters 106-2 and 111-2 (such as within 300 Hz-900 Hz), and that the frequency fb is within the passband of the third filters 106-3 and 111-3 (such as within 900 Hz-2700 Hz). Incidentally, these values are only an example, and the following advantages can be obtained even if the input signal 100 contains a signal component with any given frequency.

In FIG. 4A(a), the input signal 100 is first split into five bands through the first filter group 105, and five band-limited signals 107-1-107-5 are generated (FIG. 4A(b)).

More specifically, since the input signal 100 does not have a signal component within the passband of the first filter 106-1, the first band-limited signal 107-1 is a zero signal.

Since the input signal 100 has the component with frequency fa within the passband of the second filter 106-2, the second band-limited signal 107-2 is a signal with only the fa component.

Since the input signal 100 has the component with frequency fb within the passband of the third filter 106-3, the third band-limited signal 107-3 is a signal with only the fb component.

Since the input signal 100 does not have a signal component within the passband of the fourth and fifth filters 106-4 and 106-5, the fourth and fifth band-limited signals 107-4 and 107-5 are a zero signal.

As for the three zero signals divided (band-limited signals 107-1, 107-4 and 107-5), since they have no influence on the output signal 114 finally obtained, detailed description of them will be omitted.

In FIG. 4A(c), the second band-limited signal 107-2 is multiplied by the gain factor 104 by the multiplier 108-2 to be subjected to the gain control. The second gain controlled signal 109-2 passing through the gain control has odd harmonics (3*fa, 5*fa, . . . ) generated.

In addition, in FIG. 4A(d), the third band-limited signal 107-3 is multiplied by the gain factor 104 by the multiplier 108-3 to be subjected to the gain control. The third gain controlled signal 109-3 passing through the gain control has odd harmonics (3*fa, 5*fa, . . . ) generated.

After that, in FIG. 4B(e), the second gain controlled signal 109-2 is band limited again through the second filter 111-2 of the second filter group 110 (300 Hz-900 Hz, for example).

In addition, in FIG. 4B(f), the third gain controlled signal 109-3 is band limited again through the third filter 111-3 of the second filter group 110 (900 Hz-2700 Hz, for example).

As for the filters 111-1-111-5 constituting the second filter group 110, the passband of each of the filters 111-2-111-5 except for the first filter 111 is set within two octaves as in the first filter group 105. On the other hand, as for the harmonics generated by the gain control, since they are all odd harmonics, they are composed of signal components with frequencies of three or more times greater than the fundamental signal component (fa, fb). Accordingly, the odd harmonics of the band limited signal within two octaves are always outside the band of the two octaves. Thus, the odd harmonics can be eliminated by passing the signal components that are band limited within two octaves through the filter with a passband of two octaves again (see FIGS. 4B(g) and 4B(h)).

In addition, since the first filter group 105 and the second filter group 110 are set at the same characteristics, the original signal components (fa and fb) remain without being eliminated through the second filter group 110. This enables eliminating only the odd harmonic components.

After that, in FIG. 4B(i), the signal synthesis unit 113 combines the second harmonic eliminated signal 112-2 (FIG. 4B(g)) passing through the odd harmonic elimination by the second filter 111-2 and the third harmonic eliminated signal 112-3 (FIG. 4B(h)) passing through the odd harmonic elimination by the third filter 111-3 into the single signal, forming the output signal 114.

The output signal 114 includes only the signal components with frequencies fa and fb without any newly generated odd harmonics.

Incidentally, the filter characteristics of the dynamic range control apparatus of the present embodiment 1 are designed in such a manner that the amount of attenuation becomes −3 dB at the cutoff frequency (frequency at the boundary between the two adjacent bands) of each of the filters 106-1-106-N and 111-1-111-N constituting the first filter group 105 and second filter group 110. Accordingly, as for the signal components at the cutoff frequencies of the band-limited signals 107-1-107-N and of the harmonic eliminated signals 112-1-112-N, they are attenuated by just −6 dB compared with the input signal 100. For example, as shown in FIG. 3, the filter 106-1 attenuates the signal component with the cutoff frequency 300 Hz by −3 dB, and the filter 106-2 attenuates the signal component with the cutoff frequency 300 Hz by −3 dB, thereby attenuating −6 dB in total.

Accordingly, adding the individual harmonic eliminated signals 112-1-112-N in the signal synthesis unit 113 can increase the signal components at the cutoff frequencies by 6 dB, thereby being able to recover the intensity of the original signal component. If the phase characteristics of the adjacent bands at the cutoff frequency do not agree with each other, using an all pass filter (APF) before the signal synthesis unit 113 can bring the phases into agreement. Adding the signals with their phases made uniform can increase the signal strength by 6 dB.

As described above, according to the embodiment 1, the dynamic range control apparatus comprises the volume level calculating unit 101 that calculates the volume level value 102 approximately proportional to the volume level of the input signal 100; the gain calculating unit 103 that calculates the gain factor 104 corresponding to the volume level value 102 calculated by the volume level calculating unit 101; the first filter group 105 composed of the filters 106-1-106-N that divide the input signal 100 into N bands and output the band-limited signals 107-1-107-N; the multipliers 108-1-108-N that multiply the band-limited signals 107-1-107-N output from the first filter group 105 by the gain factor 104 calculated by the gain calculating unit 103 to carry out gain control; the second filter group 110 composed of the filters 111-1-111-N that extract a prescribed band of the gain controlled signals 109-1-109-N output from the multipliers 108-1-108-N; and the signal synthesis unit 113 that combines the harmonic eliminated signals 112-1-112-N output from the second filter group 110 into a single output signal 114. Thus, the dynamic range control apparatus can eliminate all or almost all the odd harmonics generated by the gain control. Accordingly, it can carryout high quality dynamic range control without sound quality deterioration.

In addition, according to the embodiment 1, part or all of the filters 106-1-106-N constituting the first filter group 105 are constructed in such a manner that their passbands are set within two octaves. This enables eliminating the odd harmonics generated outside the two octave bands by the gain control.

Incidentally, applying BPFs with the passbands within two octaves to all the filters 106-1-106-N and filters 111-1-111-N as in the foregoing (2) SETUP EXAMPLE 2 of FILTER CHARACTERISTICS makes it possible to eliminate all the odd harmonics produced by the gain control.

On the other hand, when applying the LPFs to the first filter 106-1 and filter 111-1 with the cutoff frequency of the lowest frequency $f_c$ [Hz] among all the filters as in the foregoing (1) SETUP EXAMPLE 1 of FILTER CHARACTERISTICS, a signal within the band of $0-f_c/3$ [Hz] has odd harmonic distortion left in spite of the filtering processing of the filter 111-1. Thus, although part of the odd harmonics produced by the gain control cannot be eliminated, since it is difficult to perceive the low frequency harmonics as sound quality deterioration, this does not cause any problem in practical use.

In addition, according to the embodiment 1, the filters 111-1-111-N constituting the second filter group 110 are configured in such a manner as to have approximately the same configurations as the filters 106-1-106-N constituting the first filter group 105. Thus, it can eliminate only the odd harmonic components without eliminating the signal components resulting from the input signal 100 originally contained in the gain controlled signals 109-1-109-N.

Embodiment 2

Figure 5:
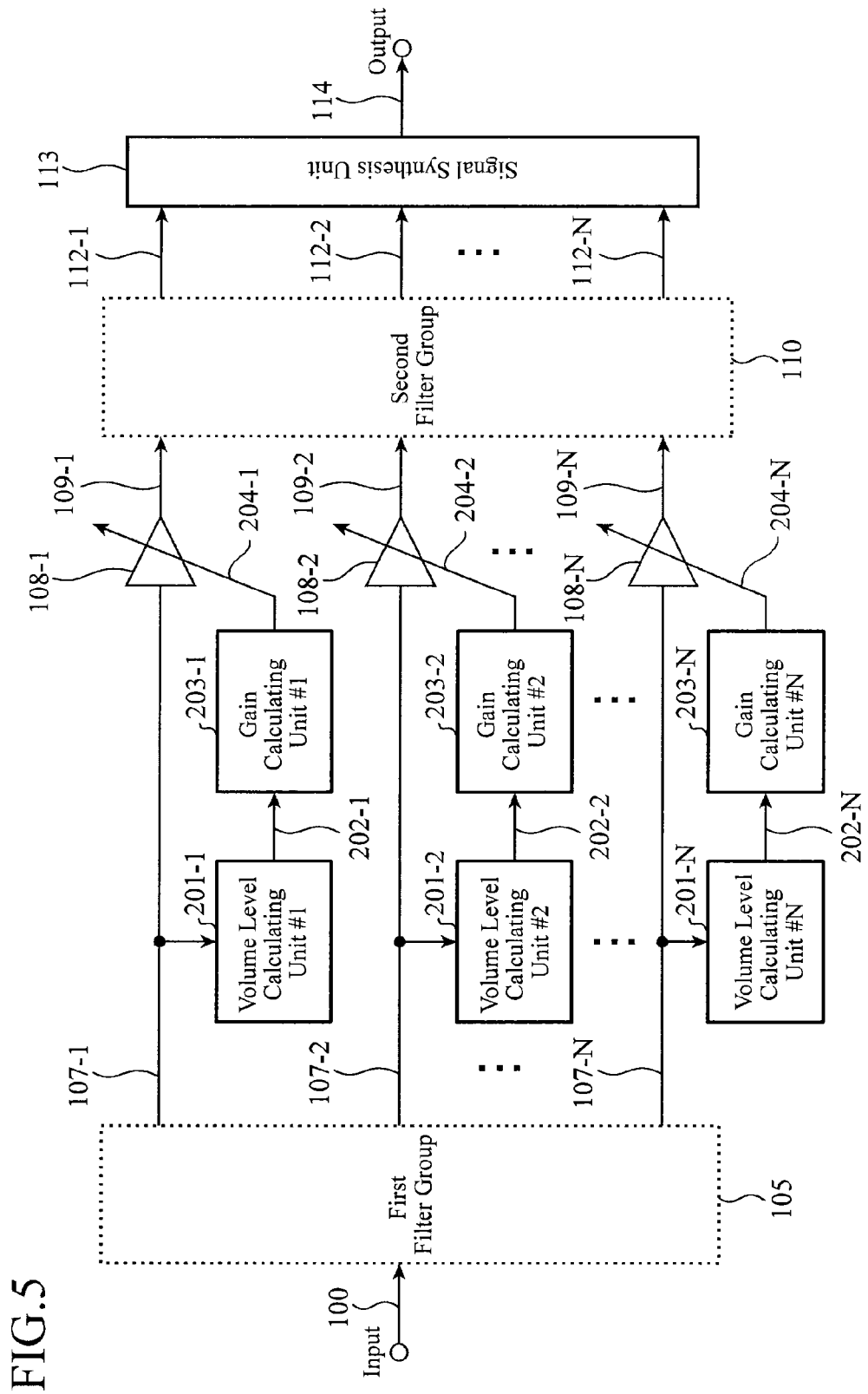
FIG. 5 is a block diagram showing a configuration of a dynamic range control apparatus of an embodiment 2 in accordance with the present invention.
Figure 6:
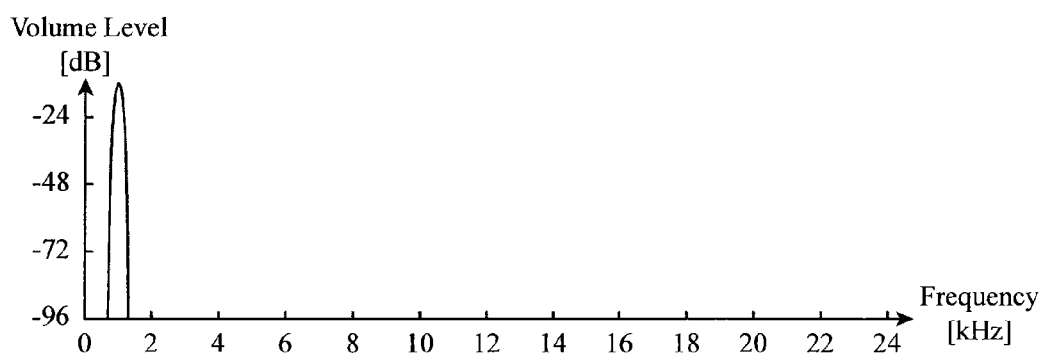
Figure 6:
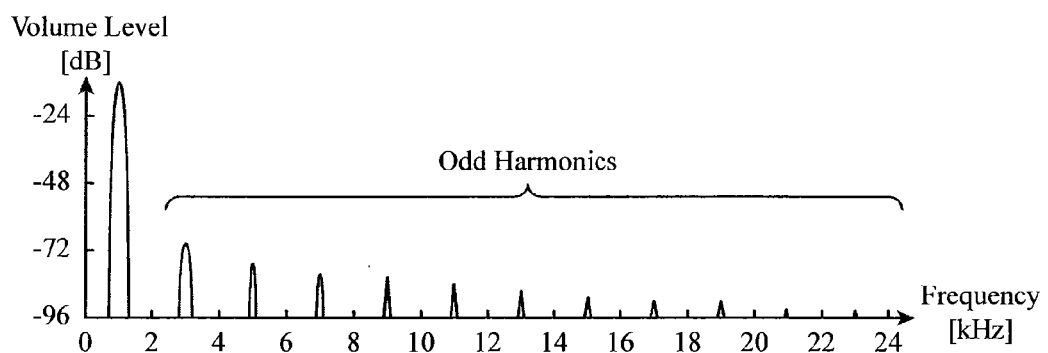
Figure 7:
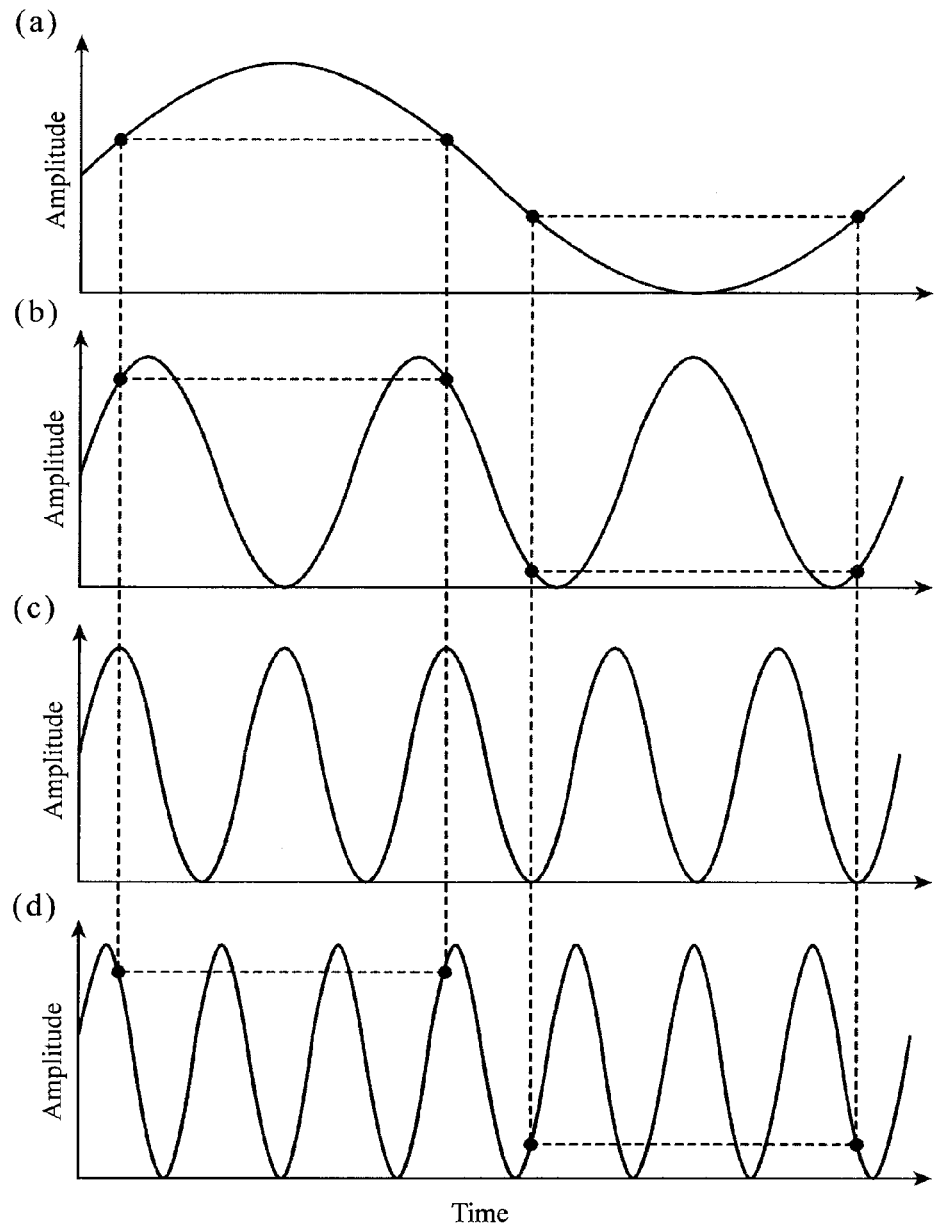
Figure 8:
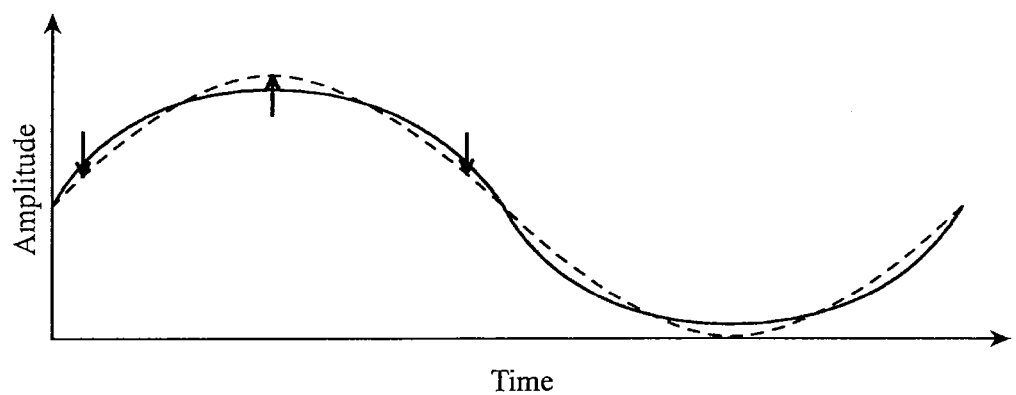
FIG. 8 is a graph showing a time waveform of an output signal passing through the conventional dynamic range control.

FIG. 5 is a block diagram showing a main part of a configuration of a dynamic range control apparatus of an embodiment 2 in accordance with the present invention. Incidentally, in FIG. 5, the same or like components to those of FIG. 1 are designated by the same reference numerals, and their description will be omitted.

The dynamic range control apparatus of the present embodiment 2 differs from that of the embodiment 1 in that it comprises N volume level calculating units 201-1-201-N and N gain calculating units 203-1-203-N instead of the single volume level calculating unit 101 and the gain calculating unit 103.

In FIG. 5, the N band-limited signals 107-1-107-N output from the first filter group 105 are each split into two parts, and first parts are supplied to the multipliers 108-1-108-N as in the foregoing embodiment 1, and second parts are supplied to the volume level calculating units 201-1-201-N.

The N volume level calculating units 201-1-201-N calculate the individual volume level values of the band-limited signals 107-1-107-N supplied thereto in the same calculating method as that of the volume level calculating unit 101 of the foregoing embodiment 1, and supply the N volume level values 202-1-202-N calculated to the N gain calculating units 203-1-203-N.

Here, although in the foregoing embodiment 1 the volume level value 102 is calculated from the signal components of the whole band of the input signal 100, the volume level values 202-1-202-N in the present embodiment 2 are each calculated from an individual signal component within two octaves in the input signal 100.

The N gain calculating units 203-1-203-N calculate the gain factors 204-1-204-N in accordance with the input volume level values 202-1-202-N at the present time (that is, at the point of input of the volume level values) and supply them to the N multipliers 108-1-108-N. As for a calculating method of the gain factor, it can be the same as that of the foregoing embodiment 1, and the conversion table as shown in FIG. 2 can be used by the individual gain calculating units 203-1-203-N, for example.

In the following description, the foregoing (1) SETUP EXAMPLE 1 of FILTER CHARACTERISTICS is applied: the first filter 106-1 of the first filter group 105 uses an LPF with a passband not greater than a frequency f; the second filter 106-2 uses a BPF with a passband from the frequency f to 3f; the third and above filters 106-3-106-N use BPFs with a passband of two octaves from the frequency 3f and above. Although the explanation will be omitted, it goes without saying that the foregoing (2) SETUP EXAMPLE 2 of FILTER CHARACTERISTICS is also applicable to the present embodiment 2.

In the foregoing concrete example, the first volume level calculating unit 201-1 calculates the volume level value of the input band-limited signal 107-1 not greater than the frequency f, and supplies the calculated volume level value 202-1 to the first gain calculating unit 203-1. The first gain calculating unit 203-1 calculates the gain factor 204-1 at the present time from the input volume level value 202-1, and supplies it to the first multiplier 108-1.

The second volume level calculating unit 201-2 calculates the volume level value of the band-limited signal 107-2 with the input frequency f–3f, and supplies the calculated volume level value 202-2 to the second gain calculating unit 203-2. The second gain calculating unit 203-2 calculates the gain factor 204-2 at the present time from the input volume level value 202-2, and supplies it to the second multiplier 108-2.

Likewise, the Nth volume level calculating unit 201-N calculates the volume level value of the input band-limited signal 107-N within two octaves, and supplies the calculated volume level value 202-N to the Nth gain calculating unit 203-N. The Nth gain calculating unit 203-N calculates the gain factor 204-N at the present time from the input volume level value 202-N, and supplies it to the Nth multiplier 108-N.

The N multipliers 108-1-108-N multiply the input band-limited signals 107-1-107-N by the gain factors 204-1-204-N, and supply the resultant gain controlled signals 109-1-109-N to the second filter group 110.

Then, the N filters 111-1-111-N of the second filter group 110 eliminate the odd harmonics from the gain controlled signals 109-1-109-N each, and supply the harmonic eliminated signals 112-1-112-N after the elimination to the signal synthesis unit 113. The signal synthesis unit 113 combines the input harmonic eliminated signals 112-1-112-N to generate the output signal 114.

As described above, according to the embodiment 2, the dynamic range control apparatus comprises the first filter group 105 including the filters 106-1-106-N that split the input signal 100 into the N bands and output the band-limited signals 107-1-107-N; the volume level calculating units 201-1-201-N that calculate the volume level values 202-1-202-N approximately proportional to the volume levels of the band-limited signals 107-1-107-N output from the first filter group 105; the gain calculating units 203-1-203-N that calculate the gain factors 204-1-204-N corresponding to the volume level values 202-1-202-N calculated by the volume level calculating units 201-1-201-N; the multipliers 108-1-108-N that multiply the band-limited signals 107-1-107-N output from the first filter group 105 by the gain factors 204-1-204-N calculated by the gain calculating units 203-1-203-N to execute the gain control; the second filter group 110 including the filters 111-1-111-N that extract the prescribed bands from the gain controlled signals 109-1-109-N output from the multipliers 108-1-108-N; and the signal synthesis unit 113 that combines the harmonic eliminated signals 112-1-112-N supplied from the second filter group 110 into the single output signal 114. Thus, the present embodiment 2 eliminates the odd harmonic components through the second filter group 110 in the same manner as the foregoing embodiment 1, and hence can eliminate all or almost all the odd harmonics generated by the gain control. Accordingly, it can carry out high quality dynamic range control without any sound quality deterioration.

Furthermore, although the foregoing embodiment 1 carries out the dynamic range control using the common gain factor 104 based on the volume level of the whole input signal 100, the present embodiment 2 can perform the individual dynamic range control using the individual gain factors 204-1-204-N for the individual signal bands (range). This enables various dynamic range control such as emphasizing a specific range by carrying out the dynamic range control of only the voice band in the input signal 100 to emphasize only voice, or emphasizing a low range more than the other range in the input signal 100 by carrying out the dynamic range control to produce more impressive sound.

In that case, for example, the conversion table the gain calculating units 203-1-203-N use to convert the volume levels to the gain factors should be adjusted individually for each of the bands to be processed by the gain calculating units 203-1-203-N.

Furthermore, a configuration is also possible which assigns plural types of conversion tables to the individual gain calculating units 203-1-203-N, and uses different conversion tables in accordance with instructions from the outside to enable using different dynamic range control that emphasizes voice band or dynamic range control that emphasizes low range in a single dynamic range control apparatus.

As a result, according to the embodiment 2, it can carry out high quality, various types of dynamic range control.

In addition, according to the embodiment 2, a part or all of the filters 106-1-106-N constituting the first filter group 105 are configured so as to have a passband within two octaves as in the foregoing embodiment 1. Accordingly, it can eliminate the odd harmonics that occur outside the bands of two octaves by the gain control.

In addition, according to the embodiment 2, the filters 111-1-111-N constituting the second filter group 110 are configured approximately the same as the filters 106-1-106-N constituting the first filter group 105 as in the foregoing embodiment 1. Accordingly, it can eliminate only the odd harmonic components without eliminating the original signal components resulting from the input signal 100 which is contained in the gain controlled signals 109-1-109-N from the first.

Incidentally, it is to be understood that a free combination of the individual embodiments, variations of any components of the individual embodiments or removal of any components of the individual embodiments are possible within the scope of the present invention.

INDUSTRIAL APPLICABILITY

As described above, a dynamic range control apparatus in accordance with the present invention carries out the dynamic range control of the signal that is band limited through the first filter group, and eliminates odd harmonics through the second filter group with the same filter characteristics as the first filter group to improve the quality of the signal. Accordingly, it is suitable for applications to audio apparatuses.

DESCRIPTION OF REFERENCE SYMBOLS 100 input signal; 101, 201-1-201-N volume level calculating unit; 102, 202-1-202-N volume level value; 103, 203-1-203-N gain calculating unit; 104, 204-1-204-N gain factor; 105 first filter group; 106-1-106-N, 111-1-111-N filters; 107-1-107-N band-limited signal; 108-1-108-N multiplier; 109-1-109-N gain controlled signal; 110 second filter group; 112-1-112-N harmonic eliminated signal; 113 signal synthesis unit; 114 output signal.

What is claimed is:

1. A dynamic range control apparatus comprising:
    a volume level calculating unit that calculates a volume level value approximately proportional to a volume level of an input sound signal;
    a gain calculating unit that calculates a gain factor corresponding to the volume level value calculated by the volume level calculating unit;
    a first filter group including N filters that split the sound signal into N (>1) frequency bands, and output N band-limited signals;
    N multipliers that multiply the N band-limited signals output from the first filter group by the gain factor calculated by the gain calculating unit to carry out gain control;
    a second filter group including N filters that extract prescribed frequency bands from the N band-limited signals output from the N multipliers, respectively; and
    a signal synthesis unit that combines the N band-limited signals output from the second filter group into a single signal.

2. The dynamic range control apparatus according to claim 1, wherein
    a part or all of the N filters constituting the first filter group have a passband within approximately two octaves.

3. The dynamic range control apparatus according to claim 1, wherein
    the N filters constituting the second filter group have approximately the same characteristics as the N filters constituting the first filter group.

4. A dynamic range control apparatus comprising:
    a first filter group including N filters that split an input sound signal into N (>1) frequency bands, and output N band-limited signals;
    N volume level calculating units that calculate N volume level values approximately proportional to volume levels of the N band-limited signals output from the first filter group;
    N gain calculating units that calculate N gain factors corresponding to the N volume level values calculated by the N volume level calculating units;
    N multipliers that multiply the N band-limited signals output from the first filter group by the N gain factors calculated by the N gain calculating units to carry out gain control;
    a second filter group including N filters that extract prescribed frequency bands from the N band-limited signals output from the N multipliers, respectively; and
    a signal synthesis unit that combines the N band-limited signals output from the second filter group into a single signal.

5. The dynamic range control apparatus according to claim 4, wherein
    a part or all of the N filters constituting the first filter group have a passband within approximately two octaves.

6. The dynamic range control apparatus according to claim 4, wherein
    the N filters constituting the second filter group have approximately the same characteristics as the N filters constituting the first filter group.

* * * * *